US012807458B2

(12) United States Patent
Lee et al.

(10) Patent No.: US 12,807,458 B2
(45) Date of Patent: Nov. 24, 2026

(54) TOWER LIFT

(71) Applicant: SEMES CO., LTD., Chungcheongnam-do (KR)

(72) Inventors: Myungjin Lee, Hwaseong-si (KR); Chuljun Park, Seoul-si (KR); Seungkeun Jun, Hwaseong-si (KR); Nahyun Lee, Ansan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 525 days.

(21) Appl. No.: 18/489,933

(22) Filed: Oct. 19, 2023

(65) Prior Publication Data

US 2024/0158205 A1 May 16, 2024

(30) Foreign Application Priority Data

Nov. 14, 2022 (KR) ........................ 10-2022-0151996

(51) Int. Cl.
*B66B 5/22* (2006.01)
*B66B 1/36* (2006.01)
(Continued)

(52) U.S. Cl.
CPC ................ *B66B 5/22* (2013.01); *B66B 1/365* (2013.01); *B66B 5/18* (2013.01); *B66B 7/04* (2013.01);
(Continued)

(58) Field of Classification Search
CPC .. B66B 5/22; B66B 1/365; B66B 5/18; B66B 7/04; B66B 11/0492; H10P 72/3204;
(Continued)

(56) References Cited

U.S. PATENT DOCUMENTS 6,719,101 B2 4/2004 Hugel
11,078,045 B2 * 8/2021 Billard ...................... B66B 5/18
(Continued)

FOREIGN PATENT DOCUMENTS

JP H03-003875 A 1/1991
JP 2002-220173 A 8/2002
(Continued)

OTHER PUBLICATIONS

Korean Office Action issued in corresponding KR Patent Application No. 10-2022-0151996, dated May 9, 2024, pp. 1-12.
(Continued)

*Primary Examiner* — Zachary L Kuhfuss
(74) *Attorney, Agent, or Firm* — Carter, DeLuca & Farrell LLP

(57) ABSTRACT

Provided is a tower lift including a rail module extending in a vertical direction, a carriage module provided to be movable along the rail module by magnetic levitation, and a brake device integrated with the carriage module and configured to move along the rail module, wherein the brake device includes a base body structure having a relative position fixed with respect to the carriage module, and providing an inclined surface, and a brake structure moving along the inclined surface of the base body structure to stop a drop of the carriage module by selectively coming in contact with the rail module, the rail module is between the base body structure and the brake body so that the brake structure is in contact with both side walls of the rail module, and the brake structure stops the drop of the carriage module when power for driving the tower lift is cut off.

16 Claims, 8 Drawing Sheets

(51) Int. Cl.

| | |
|---|---|
| ***B66B 5/18*** | (2006.01) |
| ***B66B 7/04*** | (2006.01) |
| ***B66B 11/04*** | (2006.01) |
| ***H10P 72/30*** | (2026.01) |

(52) U.S. Cl.
CPC ...... *B66B 11/0492* (2013.01); *H10P 72/3204* (2026.01); *H10P 72/3206* (2026.01); *H10P 72/3202* (2026.01)

(58) Field of Classification Search
CPC ............. H10P 72/3206; H10P 72/3202; H10P 72/3218; H10P 72/3402
See application file for complete search history.

(56) References Cited

U.S. PATENT DOCUMENTS

| | | | | |
|---|---|---|---|---|
| 2019/0144240 | A1* | 5/2019 | Steinhauer | B66B 1/06<br>187/376 |
| 2021/0300693 | A1* | 9/2021 | Lee | B65G 54/02 |

FOREIGN PATENT DOCUMENTS

| | | | |
|---|---|---|---|
| JP | 2004-338901 | A | 12/2004 |
| KR | 10-1101150 | B1 | 1/2012 |
| KR | 10-2014-0013624 | A | 2/2014 |
| KR | 10-1549995 | B1 | 9/2015 |
| KR | 10-1698546 | B1 | 1/2017 |
| KR | 10-1998604 | B1 | 7/2019 |
| KR | 20-0491485 | Y1 | 4/2020 |
| KR | 10-2548295 | B1 | 6/2023 |

OTHER PUBLICATIONS

Notice of Allowance issued in corresponding KR Patent Application No. 10-2022-0151996 , dated Jan. 20, 2025.

* cited by examiner

TOWER LIFT

CROSS-REFERENCE TO RELATED APPLICATION

This application is based on and claims priority under 35 U.S.C. § 119 to Korean Patent Application No. 10-2022-0151996, filed on Nov. 14, 2022, in the Korean Intellectual Property Office, the disclosure of which is incorporated by reference herein in its entirety.

BACKGROUND

1. Field

The disclosure relates to a tower lift including a brake unit.

2. Description of the Related Art

In general, a manufacturing line of a semiconductor or display manufacturing factory includes multiple layers. Pieces of equipment for performing deposition, exposure, etching, ion injection, cleaning, and the like may be on each layer in a semiconductor manufacturing line. Pieces of equipment on each layer may repetitively perform a series of unit processes on a semiconductor wafer used as a semiconductor substrate or a glass substrate used as a display substrate.

Article transportation between layers in a semiconductor manufacturing line, i.e., transportation of articles such as a semiconductor wafer or a glass substrate, may be achieved by a tower lift mounted in a vertical direction through the layers.

A general tower lift includes a carriage module configured to transport an article and a rail module configured to guide the carriage module in the vertical direction. The rail module includes a driving belt, such as a timing belt, provided to elevate the carriage module upward and downward. The timing belt is coupled to the carriage module to move the carriage module upward and downward. However, when the timing belt is driven in such general tower lift, particles may be generated. For example, when the timing belt is driven by being rubbed against a pulley, particles may be generated due to rubbing of the timing belt against the pulley.

To solve this problem, moving the carriage module along the rail module by magnetic levitation may be considered. The carriage module may move upward and downward in a state of being levitated in the air without coming in contact with the rail module by power generated by a linear motor provided to the carriage module or the rail module. For a tower lift in which a carriage module moves along a rail module by magnetic levitation, the rail module does not include hardware, such as a timing belt or a rope, physically connected to the carriage module. Accordingly, if electricity for driving the tower lift is cut off, the carriage module of the tower lift may drop (free-fall).

SUMMARY

Provided are a brake unit and a tower lift, the brake unit being capable of braking the free fall of a carriage module when power for driving the tower lift is cut off.

The purpose of the disclosure is not limited thereto, and other purposes, which have not been mentioned, could be clearly understood by those of ordinary skill in the art from the description below.

Additional aspects will be set forth in part in the description which follows and, in part, will be apparent from the description, or may be learned by practice of the presented embodiments of the disclosure.

According to an aspect of the disclosure, a tower lift includes a rail module extending in a vertical direction, a carriage module provided to be movable along the rail module by magnetic levitation, and a brake device integrated with the carriage module and configured to move along the rail module, wherein the brake device includes a base body having a relative position fixed with respect to the carriage module, and providing an inclined surface, and a brake structure configured to move along the inclined surface of the base body to stop a drop of the carriage module by selectively coming in contact with the rail module, the rail module is between the base body and the brake structure so that the brake structure is in contact with both side walls of the rail module, and the brake structure is further configured to stop the drop of the carriage module when power for driving the tower lift is cut off.

The tower lift may further include an elastic member disposed on the brake structure and configured to apply an elastic force in an upward direction to the brake structure.

The brake structure may include a first brake body including a first brake pad facing one side of the rail module, a second brake body including a second brake pad facing an opposite side of the one side of the rail module, and a connection member connecting the first brake body to the second brake body so that the first brake body and the second brake body are integrally driven.

One end of the elastic member may be fixed to a connection member hooking portion formed on the connection member.

A widest surface of the first brake pad and a widest surface of the second brake pad may be configured to stop the drop of the carriage module by coming in contact with at least a portion of the rail module.

The brake device may include a driving controller configured to control driving of the brake structure according to whether the power is supplied or cut off.

The driving controller may further include an electromagnet configured to generate a magnetic force when the power is supplied, to hold the brake body so that the brake structure is separated from the rail module.

When the power is cut off, the electromagnet does not generate the magnetic force, and thus, the brake structure may move upward along the inclined surface of the base body.

When the power is supplied, the brake structure may be separated by a first distance from the rail module, and the first distance may be within 10 mm.

The base body may further include a roller bearing in contact with one surface of the brake structure and configured to be rotatable, and the brake structure is moved by the roller bearing which rotates.

According to another aspect of the disclosure, a tower lift includes a rail module extending in a vertical direction, a carriage module provided to be movable along the rail module by magnetic levitation, and a brake device integrated with the carriage module and configured to move along the rail module, wherein the brake device includes a base body having a relative position fixed with respect to the carriage module, and providing an inclined surface, a brake structure configured to move along the inclined surface of the base body to stop a drop of the carriage module by selectively coming in contact with the rail module when power for driving the tower lift is cut off, a driving controller configured to control driving of the brake structure according to whether the power is supplied or cut off, and a returner configured to return the brake structure to an original position after the brake structure stops the drop of the carriage module by selectively coming in contact with the rail module, and the rail module is between the base body and the brake structure so that the brake structure is in contact with both side walls of the rail module.

The driving controller may include an electromagnet configured to generate a magnetic force when the power is applied to the electromagnet, and a holding member, which the electromagnet holds when the magnetic force is generated.

The returner may include a motor and a contact portion connected to the motor and configured to attach the holding member to the electromagnet by using a rotational force.

The tower lift may further include an elastic member disposed on the brake structure and configured to apply an elastic force in an upward direction to the brake structure.

The brake structure may include a first brake body including a first brake pad facing one side of the rail module, a second brake body including a second brake pad facing an opposite side of the one side of the rail module, and a connection member connecting the first brake body to the second brake body so that the first brake body and the second brake body are integrally driven.

One end of the elastic member may be fixed to a connection member hooking portion formed on the connection member.

A widest surface of the first brake pad and a widest surface of the second brake pad may be configured to stop the drop of the carriage module by coming in contact with at least a portion of the rail module.

According to another aspect of the disclosure, a tower lift includes a rail module extending in a vertical direction, a carriage module provided to be movable along the rail module by magnetic levitation, and a brake device integrated with the carriage module and configured to move along the rail module, wherein the brake device includes a base body having a relative position fixed with respect to the carriage module, providing an inclined surface, and including a roller bearing in contact with one surface of the brake body and configured to be rotatable, a brake structure configured to move along the inclined surface of the base body to stop a drop of the carriage module by selectively coming in contact with the rail module, an elastic member disposed on the brake body and configured to apply an elastic force in an upward direction to the brake structure, and a driving controller configured to make the brake structure be selectively in contact with the rail module by holding the brake device only when power for driving the tower lift is supplied, the rail module is between the base body and the brake structure so that the brake structure is in contact with both side walls of the rail module, and the brake structure is further configured to stop the drop of the carriage module when the power is cut off.

The brake structure may include a first brake body including a first brake pad facing one side of the rail module, a second brake body including a second brake pad facing an opposite side of the one side of the rail module, and a connection member connecting the first brake body to the second brake body so that the first brake body and the second brake body are integrally driven, one end of the elastic member may be fixed to a connection member hooking portion formed on the connection member, and a widest surface of the first brake pad and a widest surface of the second brake pad may be configured to stop the drop of the carriage module by coming in contact with at least a portion of the rail module.

The tower lift may further include a returner configured to return the brake structure to an original position after the brake structure stops the drop of the carriage module by selectively coming in contact with the rail module, wherein the driving controller includes an electromagnet configured to generate a magnetic force when the power is applied to the electromagnet, and a holding member, which the electromagnet holds when the magnetic force is generated, and the returner includes a motor and a contact portion connected to the motor and configured to attach the holding member to the electromagnet by using a rotational force.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
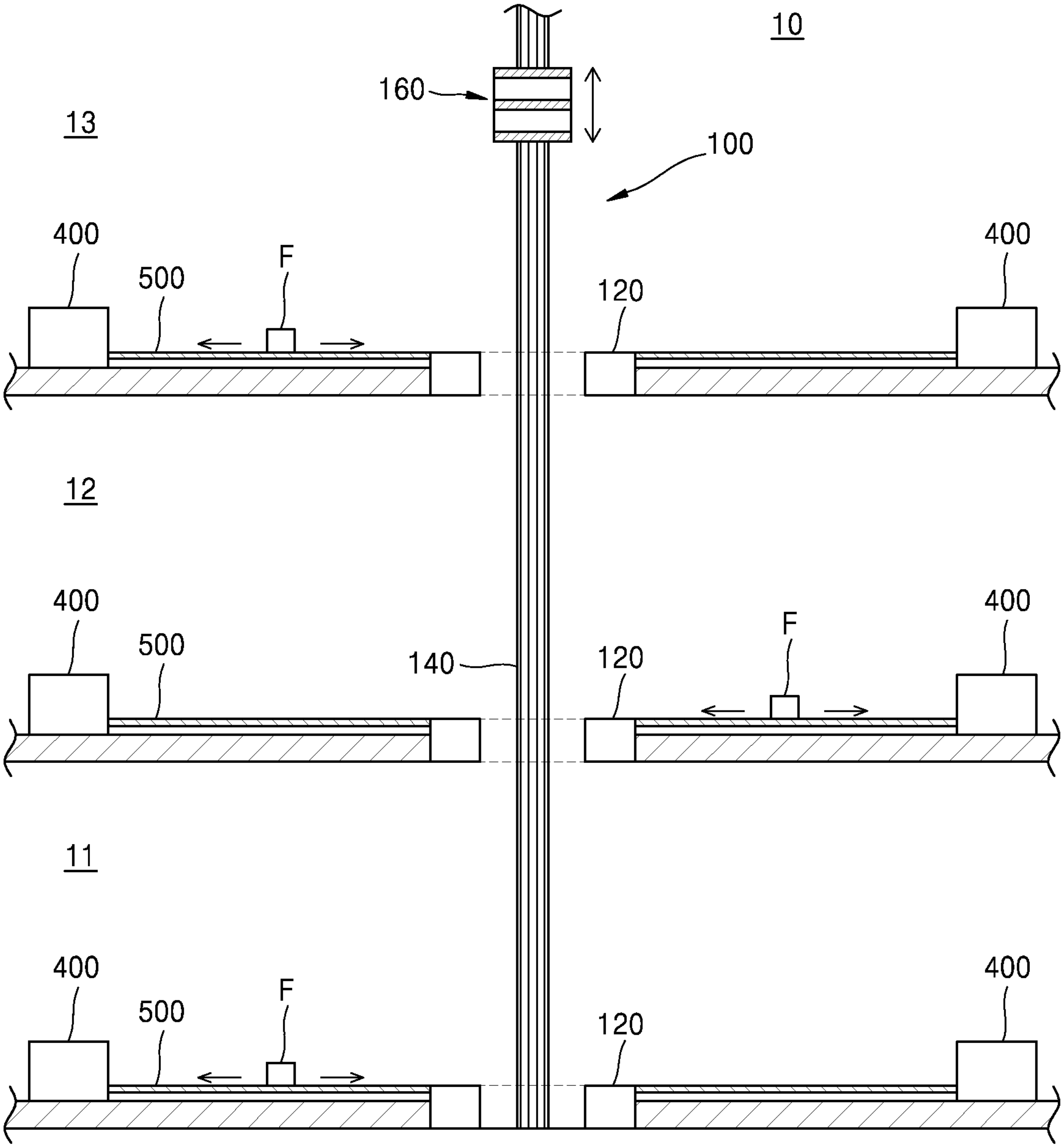
FIG. 1 is a schematic front cross-sectional view of a semiconductor manufacturing line having a tower lift mounted thereon, according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items.

FIG. 1 is a schematic front cross-sectional view of a semiconductor manufacturing line 10 having a tower lift 100 mounted thereon, according to an embodiment. Referring to FIG. 1, the semiconductor manufacturing line 10 may have a multi-layer structure. For example, the semiconductor manufacturing line 10 may have a first layer 11, a second layer 12, and a third layer 13. However, the semiconductor manufacturing line 10 is not limited thereto, and the multi-layer structure, which the semiconductor manufacturing line 10 has, may be variously modified.

To the semiconductor manufacturing line 10, the tower lift 100, a container storage 400, a transportation rail 500, and pieces of semiconductor manufacturing equipment (not shown) configured to perform a semiconductor manufacturing process may be provided.

The tower lift 100 (an example of a magnetic levitation vertical driving module) may transport a container F, accommodating an article therein, among the first, second, and third layers 11, 12, and 13 of the semiconductor manufacturing line 10. The tower lift 100 may include a stage module 120, a rail module 140, and a carriage module 160.

The stage module 120 may be provided on the bottom of each of the first, second, and third layers 11, 12, and 13 of the semiconductor manufacturing line 10. The stage module 120 may be coupled to the transportation rail 500 configured to transport the container F to the container storage 400. When the tower lift 100 transports the container F to each of the first, second, and third layers 11, 12, and 13, the container F transported to each of the first, second, and third layers 11, 12, and 13 may be transported to the container storage 400 by the transportation rail 500.

The rail module 140 may extend in a vertical direction. The rail module 140 may extend in the vertical direction between at least two layers of the semiconductor manufacturing line 10. The rail module 140 may guide movement of the carriage module 160 to be described below. In addition, the rail module 140 may move, in the vertical direction, the carriage module 160 to be described below.

The carriage module 160 (an example of a moving body) may be configured to be movable along the rail module 140. For example, the carriage module 160 may be configured to be movable in the vertical direction along the rail module 140. The carriage module 160 may have a carriage 162 (see FIG. 2) carrying an article thereon. A plurality of carriage modules 160 may be provided. For example, the number of carriage modules 160 may be variously changed.

The carriage 162 of the carriage module 160 may provide a space in which the container F may be seated. Alternatively, the carriage module 160 may have a robot configured to hold the container F. The carriage module 160 may be modified to various structures capable of moving the container F.

Hereinafter, the rail module 140 and the carriage module 160 according to an embodiment are described in detail.

Figure 2:
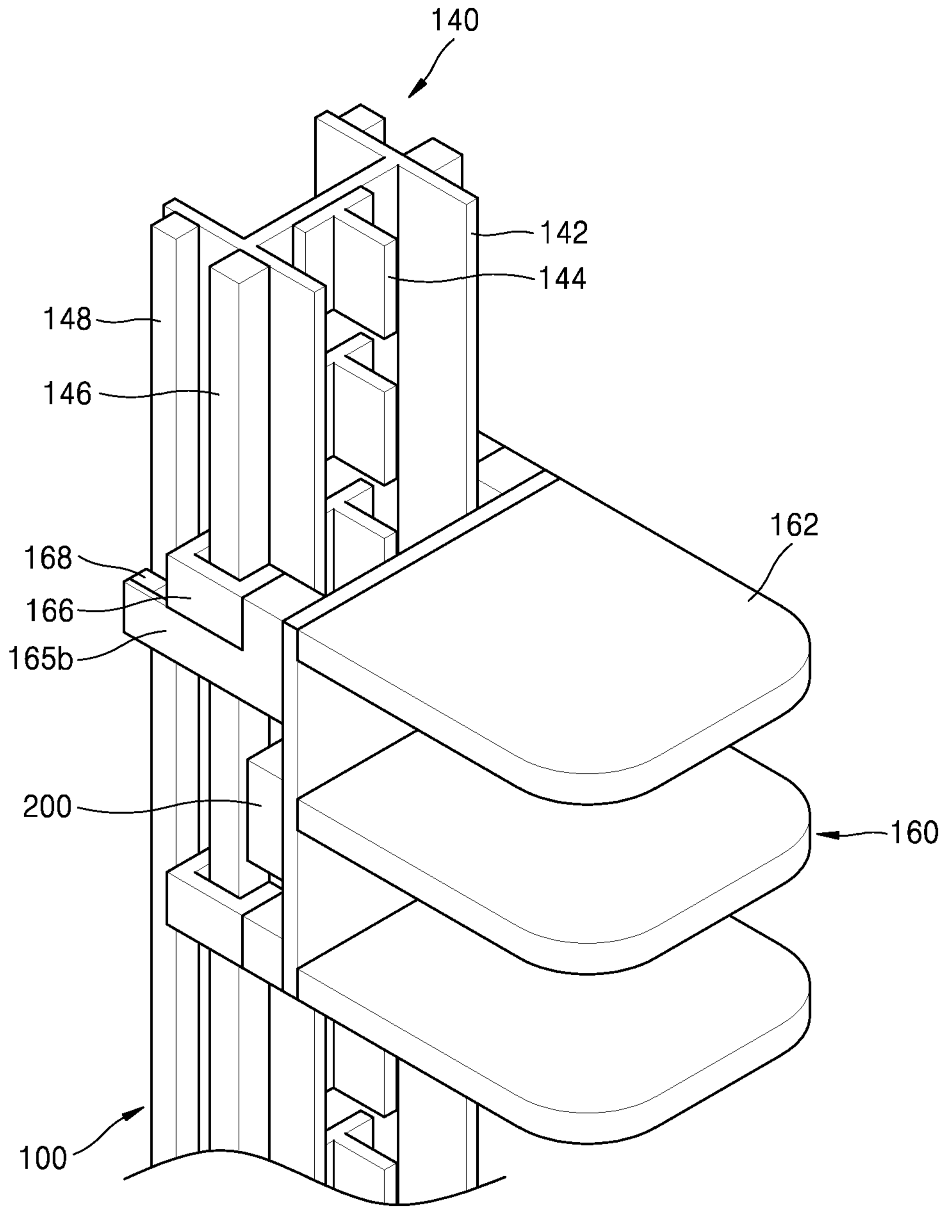
FIG. 2 is a perspective view of a rail module and a carriage module of a tower lift according to an embodiment.
Figure 3:
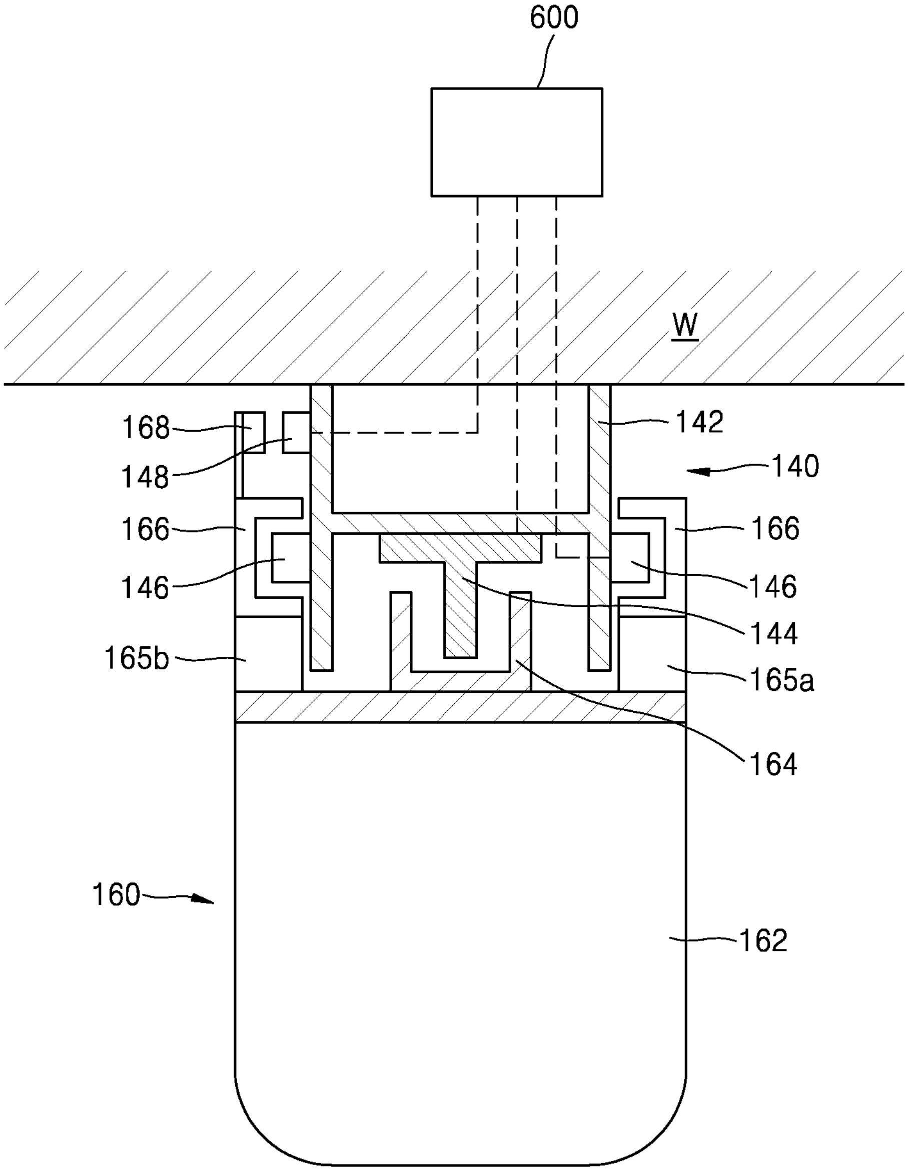
FIG. 3 is a top cross-sectional view of the rail module and the carriage module of the tower lift according to an embodiment.

FIG. 2 is a perspective view of the rail module 140 and the carriage module 160 of the tower lift 100 according to an embodiment. FIG. 3 is a top cross-sectional view of the rail module 140 and the carriage module 160 of the tower lift 100 according to an embodiment.

Referring to FIGS. 2 and 3, the rail module 140 may include a frame 142, a linear motor coil 144, a guide rail 146, and a power transmitter 148.

The frame 142 may extend in the vertical direction. A longitudinal direction of the frame 142 may be the vertical direction. The frame 142 may be fixedly provided to a wall W of the semiconductor manufacturing line 10 (see FIG. 1). The linear motor coil 144, the guide rail 146, and the power transmitter 148, which are to be described below, may be coupled to the frame 142. The frame 142 may generally have an H shape in a top view but is not limited thereto, and the shape of the frame 142 may be variously changed.

The linear motor coil 144 may move the carriage 162 in the vertical direction by interacting with a linear motor magnet 164 to be described below. The interaction may be caused by a magnetic force generated by the linear motor coil 144 and/or the linear motor magnet 164. The linear motor coil 144 may be provided on the frame 142. The linear motor coil 144 may be provided on a surface of the frame 142, which faces the carriage module 160 in a top view. The linear motor coil 144 may generally have a T shape.

In addition, an interface line (not shown), such as a power line, may be connected to the linear motor coil 144. In addition, a plurality of pairs of linear motor coils 144 may be provided. The plurality of pairs of linear motor coils 144 may be provided on the frame 142 to be spaced apart from each other in the vertical direction in which the frame 142 extends.

The guide rail 146 may constrain a portion of a degree of freedom of the carriage module 160. The guide rail 146 may constrain a degree of freedom remaining by excluding a degree of freedom of vertical-direction movement of the carriage module 160. The guide rail 146 may be spaced apart from a guide portion 166, which the carriage module 160 to be described below has, by a repulsive force due to a magnetic force. An interface line (not shown), such as a power line, may be connected to the guide rail 146. In addition, a gap sensor (not shown) may be provided to either the guide rail 146 or the guide portion 166, and the magnetic force may be controlled based on a measurement value measured by the gap sensor. Accordingly, a gap between the guide rail 146 and the guide portion 166 may be controlled to be substantially constant.

At least one guide rail 146 may be provided. For example, a plurality of guide rails 146 may be provided. Any one of the plurality of guide rails 146 may be provided on one surface of the frame 142, and another one of the plurality of guide rails 146 may be provided on the other surface of the frame 142. For example, any one of the plurality of guide rails 146 may be provided on one side wall of the frame 142, and another one of the plurality of guide rails 146 may be provided on the other side wall of the frame 142. In addition, a longitudinal direction of the guide rail 146 may be the same as the longitudinal direction of the frame 142.

The power transmitter 148 may transmit power to a power receiver 168 of the carriage module 160 to be described below. For example, the power transmitter 148 may be any one of components of a contactless power supply (HID) configured to supply power in a contactless manner. The power transmitter 148 may be provided on the frame 142. The power transmitter 148 may be provided on any one of surfaces of the frame 142, on which the plurality of guide rails 146 are provided. For example, the power transmitter 148 may be provided on one side wall among the surfaces of the frame 142, on which the plurality of guide rails 146 are provided. An interface line (not shown), such as a power line, may be connected to the power transmitter 148.

The carriage module 160 may transport the container F accommodating an article therein. The carriage module 160 may be configured to be movable in the vertical direction along the rail module 140. The carriage module 160 may move in the vertical direction along the rail module 140 to transport the container F accommodating an article therein to each of the first, second, and third layers 11, 12, and 13 of the semiconductor manufacturing line 10. The carriage module 160 may include the carriage 162, the linear motor magnet 164, a connection body **165*a* and 165*b*, the guide portion 166, and the power receiver 168**.

The carriage 162 may have a seating shelf shape on which the container F accommodating an article therein is seated. A robot (not shown) configured to hold the container F accommodating an article therein may be provided to the carriage 162. Although FIG. 2 shows that the carriage 162 has a three-stage shelf shape, the carriage 162 is not limited thereto, and the shape of the carriage 162 may be variously changed.

The linear motor magnet 164 may be coupled to the carriage 162. The linear motor magnet 164 may move the carriage 162 in the vertical direction by interacting with the linear motor coil 144 described above. The interaction may be caused by the magnetic force generated by the linear motor coil 144 and/or the linear motor magnet 164.

In addition, the linear motor magnet 164 may generally have a U shape in a top view. Accordingly, a portion of the linear motor coil 144 may be inserted into an open part of the linear motor magnet 164.

The connection body 165*a* and 165*b* may couple the guide portion 166 and the power receiver 168, which are to be described below, to the carriage 162. The connection body 165*a* and 165*b* may include a first connection body 165*a* and a second connection body 165*b*. The first connection body 165*a* and the second connection body 165*b* may have different shapes from each other. The second connection body 165*b* may couple the guide portion 166 and the power receiver 168 to the carriage 162. The first connection body 165*a* may couple the guide portion 166 to the carriage 162.

The guide portion 166 may be coupled to the carriage 162 by the connection body 165*a* and 165*b*. Accordingly, when the carriage 162 moves, the guide portion 166 may move with the carriage 162 in the vertical direction. The guide portion 166 may have a shape surrounding at least a portion of the guide rail 146 provided on the frame 142. The guide portion 166 may have a square-cornered C shape in a top view. The guide rail 146 may be inserted into the guide portion 166. Accordingly, the guide portion 166 may constrain, together with the guide rail 146, a degree of freedom remaining by excluding a degree of freedom of vertical-direction movement of the carriage module 160. In addition, a gap sensor (not shown) may be provided to either the guide rail 146 or the guide portion 166, and the magnetic force may be controlled based on a measurement value measured by the gap sensor. Accordingly, the gap between the guide rail 146 and the guide portion 166 may be controlled to be substantially constant.

The power receiver 168 may receive the power transmitted from the power transmitter 148. In addition, the power receiver 168 may be provided to face the power transmitter 148. The power receiver 168 may be any one of the components of the contactless power supply (HID) configured to supply power in a contactless manner. The power receiver 168 may be coupled to the carriage 162 by the medium of the second connection body 165*b*. Accordingly, when the carriage 162 moves, the power receiver 168 may move with the carriage 162 in the vertical direction.

The carriage module 160 according to an embodiment may include the linear motor magnet 164, and the linear motor magnet 164 may move the carriage 162 along the rail module 140 by interacting with the linear motor coil 144. That is, the carriage module 160 according to an embodiment may move along the rail module 140 by magnetic levitation. In a general tower lift, a carriage module moves by friction between a timing belt and a pulley, and in this case, particles may occur. However, the carriage module 160 according to an embodiment may move along the rail module 140 by magnetic levitation. Accordingly, a problem that particles occur may be minimized.

In addition, the carriage module 160 may include the power receiver 168 and receive power from the power transmitter 148 in a contactless manner. That is, power necessary for driving the carriage module 160 may receive in a contactless manner. In addition, according to the disclosure, the linear motor coil 144 requiring a power line connected thereto may be provided on the frame 142, and the carriage module 160 may include the linear motor magnet 164 requiring no power line connected thereto. That is, all interface lines, such as a power line, may be connected to components provided on the rail module 140, and no interface lines may be connected to the carriage module 160. If interface lines were connected to the carriage module 160, the connected interface lines would act as elements interrupting an operation of the carriage module 160, but because no interface lines are connected to the carriage module 160 according to an embodiment, an operation of the plurality of carriage modules 160 may be relatively easy.

In addition, the rail module 140 may have the plurality of pairs of linear motor coils 144, which may be provided on the frame 142 to be spaced apart from each other in the longitudinal direction of the frame 142.

A controller 600 may control the tower lift 100. The controller 600 may control the tower lift 100 so that the carriage module 160 moves along the rail module 140 by magnetic levitation. In addition, the controller 600 may include a process controller including a microprocessor (computer) configured to execute a control of the tower lift 100, a user interface including a keyboard by which an operator performs a command input operation or the like to manage the tower lift 100, a display configured to visually display an operating status of the tower lift 100, and the like, and a memory storing a control program for executing processing performed in the tower lift 100 under control by the process controller, various kinds of data, and a program, i.e., a processing recipe, for executing processing of each component according to a processing condition. In addition, the user interface and the memory may be connected to the process controller. The processing recipe may be stored in a storage medium of the memory, and the storage medium may include a hard disk, a transportable disc, such as compact disc read only memory (CD-ROM) or a digital versatile disc (DVD), or a semiconductor memory, such as flash memory.

As described above, the carriage module 160 according to an embodiment may move along the rail module 140 by magnetic levitation. Accordingly, if power for driving the carriage module 160 is cut off, the carriage module 160 may drop (free-fall). Accordingly, a brake device 200 (see FIG. 4) may be provided to the carriage module 160 of the tower lift 100 according to an embodiment. If power for driving the tower lift 100 is cut off, the carriage module 160 may drop, but the brake device 200 may stop the drop of the carriage module 160 even when the power is cut off.

Figure 4:
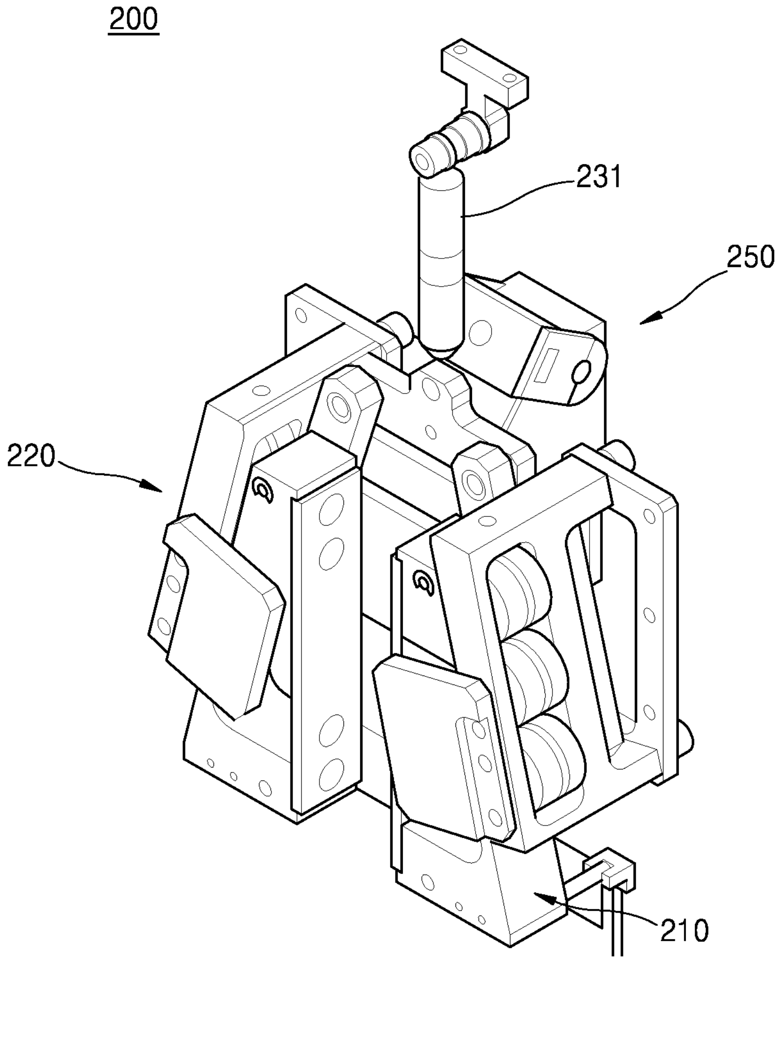
FIG. 4 is a perspective view of a brake device according to an embodiment.
Figure 5:
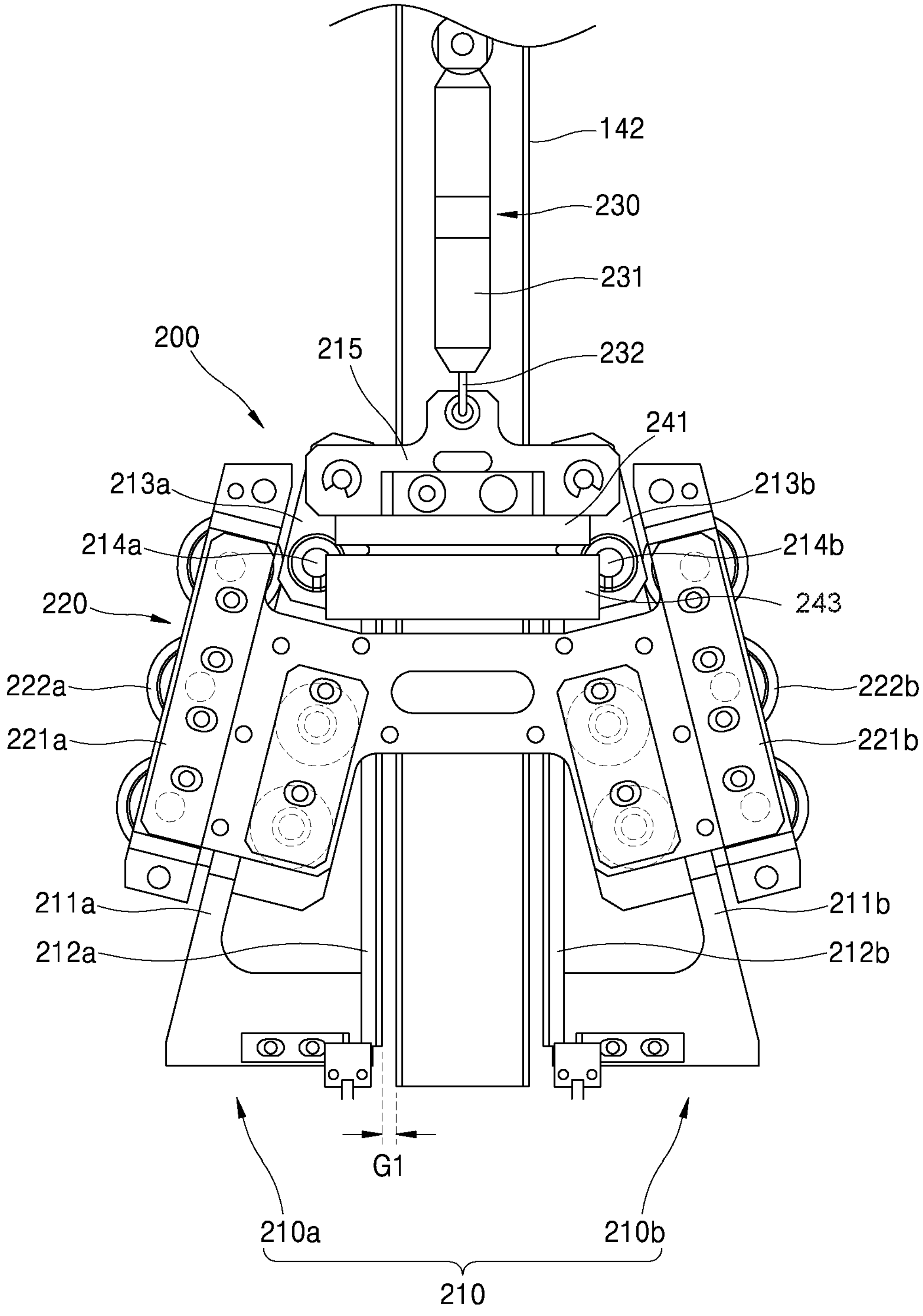
FIG. 5 is a front view of the brake device according to an embodiment.

FIG. 4 is a perspective view of the brake device 200 according to an embodiment, and FIG. 5 is a front view of the brake device 200 according to an embodiment.

Referring to FIGS. 4 and 5 together with FIG. 2, the tower lift 100 (see FIG. 2) may include the rail module 140 (see FIG. 2) extending in the vertical direction and the carriage module 160 (see FIG. 2) configured to be movable along the rail module 140 by magnetic levitation.

According to an embodiment, the tower lift 100 (see FIG. 2) include the brake device 200 integrated with the carriage module 160 (see FIG. 2) and moving along the rail module 140 (see FIG. 2). In this case, the brake device 200 may be configured to stop a drop of the carriage module 160 (see FIG. 2) when power supplied to the tower lift 100 (see FIG. 2) is cut off. The brake device 200 may include a base body structure 220 having a relatively position fixed with respect to the carriage module 160 (see FIG. 2), and providing an inclined surface. As shown in FIG. 5, the base body structure 220 may include a plurality of base bodies 221*a*, 221*b*. Particularly, the brake structure 210 may include a first brake member 210*a* facing one surface of the rail module 140 (see FIG. 2) and a second brake member 210*b* facing the other surface of the rail module 140 located in an opposite side of the one surface, with reference to the rail module 140. The first and second brake members 210*a* and 210*b* may respectively include the first and second brake bodies 211*a* and 211*b* moving along inclined surfaces of a plurality of base bodies 221*a* and 221*b*, and first and second brake pads 212*a* and 212*b* in contact with the frame 142 of the rail module 140.

According to an embodiment, the base body structure 220 may further include the plurality of roller bearings 222*a* and 222*b* in contact with one surface of a brake structure 210 and configured to be rotatable. In this case, the brake structure 210 may move by the plurality of roller bearings 222*a* and 222*b*, which rotate.

According to an embodiment, the rail module 140 may be between the plurality of base bodies 221*a* and 221*b* and the first and second brake members 210*a* and 210*b*. In addition, the first and second brake members 210*a* and 210*b* may be in contact with both side walls of the rail module 140, and the first and second brake members 210*a* and 210*b* may be configured to stop a drop of the carriage module 160 (see FIG. 2) when power for driving the tower lift 100 (see FIG. 2) is cut off.

According to an embodiment, an elastic member 231 disposed on the first and second brake bodies 211*a* and 211*b* and configured to apply an elastic force in an upward direction to the first and second brake bodies 211*a* and 211*b*. Particularly, the first and second brake bodies 211*a* and 211*b* may be connected to a plurality of links 213*a* and 213*b*), respectively. In this case, the plurality of links 213*a* and 213*b*) may be connected to the first and second brake bodies 211*a* and 211*b* through a first screw 214*a* and a second screw 214*b*, respectively. The plurality of links 213*a* and 213*b*) may be connected to a connection member 215. The elastic member 231 of a vertically moving portion 230 is connected to the connection member 215 through a connection member hooking portion 232. By doing this, the elastic member 231 may be configured to apply an elastic force in an upward direction to the first and second brake bodies 211*a* and 211*b*.

According to an embodiment, the first brake member 210*a* may include the first brake body 211*a* facing one side of the rail module 140 (see FIG. 2) According to an embodiment, the second brake member 210*b* may include the second brake body 211*b* facing one side of the rail module 140 (see FIG. 2). In this case, the connection member 215 may connect the first brake member 210*a* to the second brake member 210*b* so that the first brake member 210*a* and the second brake member 210*b* are integrally driven. In this case, one end of the elastic member 231 may be fixed to the connection member hooking portion 232 formed on the connection member 215.

According to an embodiment, a widest surface of the first brake pad 212*a* and a widest surface of the second brake pad 212*b* may stop a drop of the carriage module 160 by coming in contact with at least a portion of the rail module 140 (see FIG. 2).

According to an embodiment, the brake device 200 may include a driving controller 240 configured to control driving of the first and second brake members 210*a* and 210*b* according to whether power applied to the tower lift 100 is supplied or cut off. The driving controller 240 may include an electromagnet 241 configured to generate a magnetic force when power is supplied thereto, and hold the first and second brake bodies 211*a* and 211*b* so that the brake structure 210 is separated from the rail module 140 (see FIG. 2).

Figure 6:
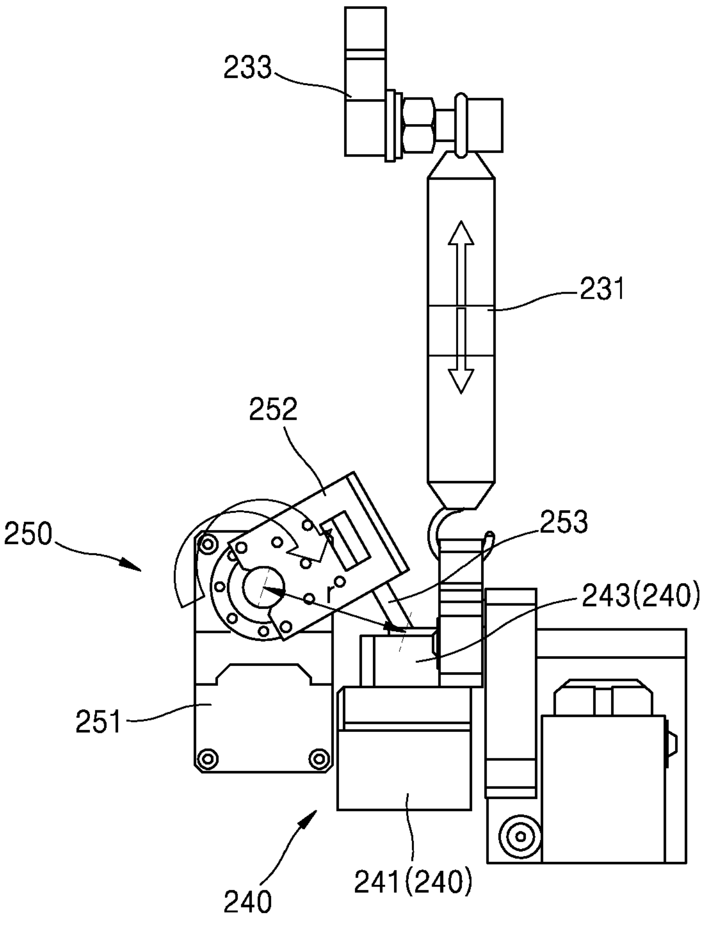
FIG. 6 is a side view of a driving controller and a returner of the brake device shown in FIGS. 4 and 5.

FIG. 6 is a side view of the driving controller 240 and a returner 250 of the brake device 200 shown in FIGS. 4 and 5.

Referring to FIG. 6, the driving controller 240 may be configured to control driving of the brake structure 210 according to whether power is supplied or cut off. According to an embodiment, the driving controller 240 may include the electromagnet 241 configured to generate a magnetic force when power is applied thereto, and a holding member 243, which the electromagnet 241 holds when the magnetic force is generated. The holding member 243 may include a metal so that the electromagnet 241 holds the holding member 243 when the magnetic force is generated.

Figure 7:
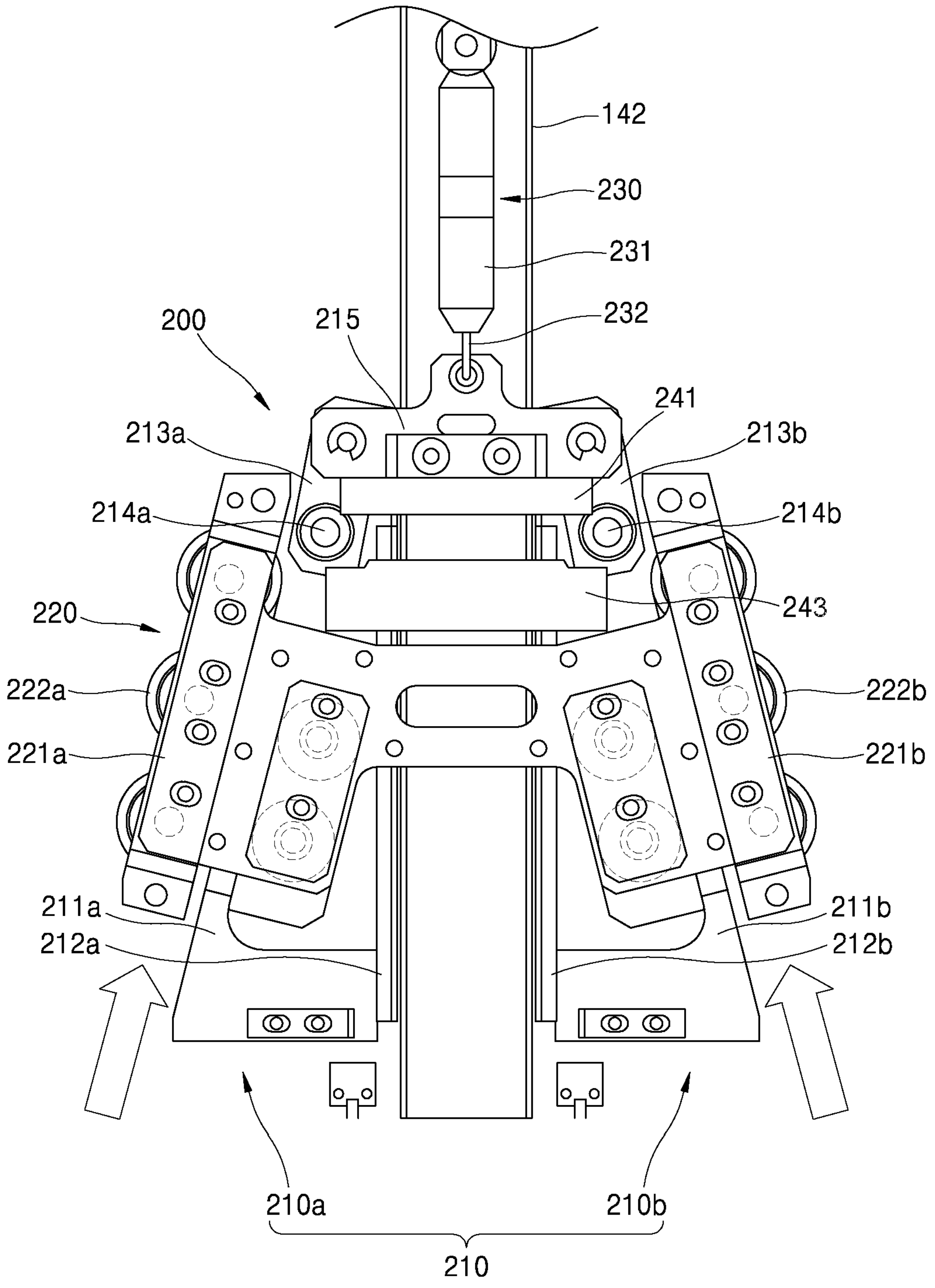
FIGS. 7 and 8 are front views illustrating an operating process of the brake device according to an embodiment.
Figure 8:
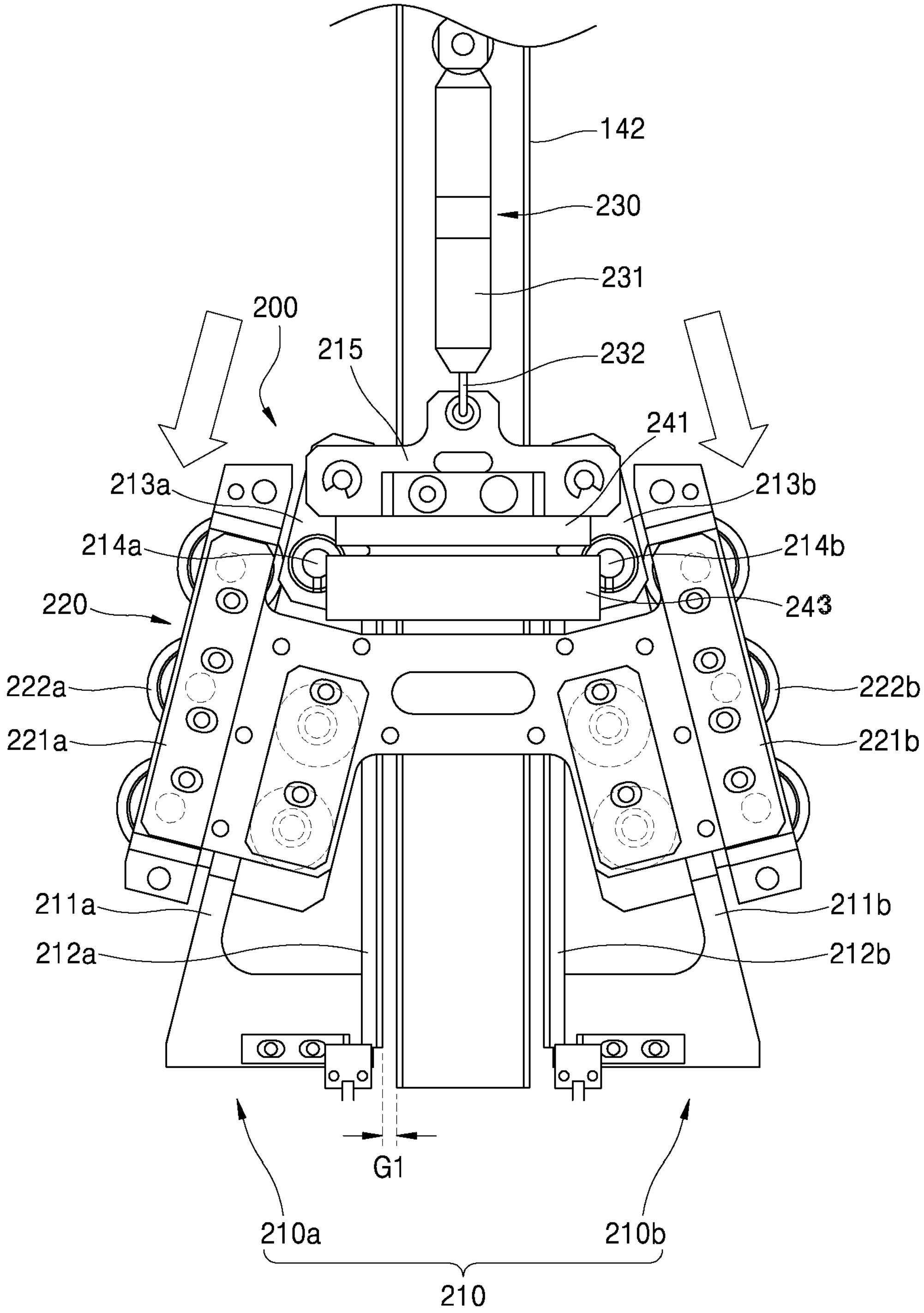

For convenience of description, referring to FIGS. 7 and 8 together, as shown in FIG. 7, when the electromagnet 241 of the driving controller 240 does not generate the magnetic force because power is cut off, the electromagnet 241 releases the holding member 243. On the contrary, as shown in FIG. 8, when the electromagnet 241 of the driving controller 240 generates the magnetic force because power is supplied thereto, the electromagnet 241 holds the holding member 243.

The returner 250 may be configured to return the brake structure 210 to an original position after stopping the drop of the carriage module 160 (see FIG. 2) by selectively coming in contact with the rail module 140 (see FIG. 2).

The returner 250 may include a motor 251 and a contact portion 252 connected to the motor 251 and configured to attach the holding member 243 to the electromagnet 241 by using a rotational force. When the motor 251 operates, the contact portion 252 connected to the motor 251 may apply pressure to an upper surface of the holding member 243. In this case, the holding member 243 may be in contact with the electromagnet 241 under the holding member 243. When the electromagnet 241 generates the magnetic force, the electromagnet 241 keeps to be in contact with the holding member 243.

FIGS. 7 and 8 are front views illustrating an operating process of the brake device 200 according to an embodiment.

FIG. 7 is a front view illustrating a case where the brake device 200 operates because power supplied to the tower lift 100 (see FIG. 2) is cut off. Referring to FIG. 7, when the power is cut off, the electromagnet 241 does not generate the magnetic force, and thus, the brake structure 210 may move upward along the inclined surfaces of the plurality of base bodies 221a and 221*b*.

When power supplied to the electromagnet 241 is curt off, the elastic member 231 may move the brake structure 210 in an inclined direction with respect to the vertical direction so that the first brake pad 212*a* of the first brake body 211*a* and the second brake pad 212*b* of the second brake body 211*b* are in contact with the rail module 140 (see FIG. 2). In addition, because the second brake body 211*b* is integrally driven with the first brake body 211*a* through the connection member 215, when the power supplied to the electromagnet 241 is cut off, the elastic member 231 may move the brake structure 210 in an inclined direction with respect to the vertical direction so that the first brake body 211*a* and the second brake body 211*b* integrally moving with the first brake body 211*a* is in contact with the rail module 140 (see FIG. 2).

FIG. 8 is a front view illustrating a case where the brake structure 210 returns to an original state because power is supplied again to the tower lift 100.

According to an embodiment, when the power is supplied to the tower lift 100, the brake structure 210 may be spaced apart by a first distance G1 from the rail module 140 (see FIG. 2). Herein, the first distance G1 may be within 10 mm.

When power is supplied again to the electromagnet 241, the contact portion 252 connected to the motor 251 may rotate to apply pressure to the upper surface of the holding member 243. In this case, the holding member 243 may be in contact with the electromagnet 241 under the holding member 243. In this case, the elastic member 231 connected to the holding member 243 may be pulled down. When the elastic member 231 is pulled down, the brake structure 210 connected to the elastic member 231 through the connection member hooking portion 232 may move downward. When the first brake member 210*a* and the second brake member 210*b* move downward, the first brake pad 212*a* of the first brake body 211*a* and the second brake pad 212*b* of the second brake body 211*b* are separated from the frame 142 of the rail module 140 (see FIG. 2).

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A tower lift comprising:

a rail module extending in a vertical direction;

a carriage module provided to be movable along the rail module by magnetic levitation;

a brake device integrated with the carriage module and configured to move along the rail module, wherein the brake device comprises:

a base body structure having a relative position fixed with respect to the carriage module, and providing an inclined surface; and a brake structure configured to move along the inclined surface of the base body structure to stop a drop of the carriage module by selectively coming in contact with the rail module, the brake structure including:

a first brake member comprising a first brake pad facing one side of the rail module;

a second brake member comprising a second brake pad facing an opposite side of the one side of the rail module; and a connection member connecting the first brake member to the second brake member so that the first brake member and the second brake member are integrally driven;

an elastic member disposed on the brake structure and configured to apply an elastic force in an upward direction to the brake structure, wherein the rail module is between the base body structure and the brake structure so that the brake structure is in contact with both side walls of the rail module, and wherein the brake structure is further configured to stop the drop of the carriage module when power for driving the tower lift is cut off.

2. The tower lift of claim 1, wherein one end of the elastic member is fixed to a connection member hooking portion formed on the connection member.

3. The tower lift of claim 1, wherein a widest surface of the first brake pad and a widest surface of the second brake pad are configured to stop the drop of the carriage module by coming in contact with at least a portion of the rail module.

4. The tower lift of claim 1, wherein the brake device further comprises a driving controller configured to control driving of the brake structure according to whether the power is supplied or cut off.

5. The tower lift of claim 4, wherein the driving controller further comprises an electromagnet configured to generate a magnetic force when the power is supplied, to hold the first brake member and the second brake member so that the brake structure is separated from the rail module.

6. The tower lift of claim 5, wherein, when the power is cut off, the electromagnet does not generate the magnetic force, and thus, the brake structure moves upward along the inclined surface of the base body.

7. The tower lift of claim 5, wherein, when the power is supplied, the brake structure is separated by a first distance from the rail module, and the first distance is 5 mm to 10 mm.

8. The tower lift of claim 1, wherein the base body structure further comprises a roller bearing in contact with one surface of the brake structure and configured to be rotatable, and the brake structure is moved by the roller bearing which rotates.

9. A tower lift comprising:

a rail module extending in a vertical direction;

a carriage module provided to be movable along the rail module by magnetic levitation; and a brake device integrated with the carriage module and configured to move along the rail module, wherein the brake device comprises:

a base body structure having a relative position fixed with respect to the carriage module, and providing an inclined surface;

a brake structure configured to move along the inclined surface of the base body structure to stop a drop of the carriage module by selectively coming in contact with the rail module when power for driving the tower lift is cut off;

a driving controller configured to control driving of the brake structure according to whether the power is supplied or cut off; and a returner configured to return the brake structure to an original position after the brake structure stops the drop of the carriage module by selectively coming in contact with the rail module;

an elastic member disposed on the brake structure and configured to apply an elastic force in an upward direction to the brake structure, wherein the rail module is between the base body structure and the brake structure so that the brake structure is in contact with both side walls of the rail module.

10. The tower lift of claim 9, wherein the driving controller comprises:

an electromagnet configured to generate a magnetic force when the power is applied to the electromagnet; and a holding member held by the electromagnet when the electromagnet generates the magnetic force.

11. The tower lift of claim 10, wherein the returner comprises:

a motor; and a contact portion connected to the motor and configured to attach the holding member to the electromagnet by using a rotational force.

12. The tower lift of claim 9, wherein the brake structure comprises:

a first brake member comprising a first brake pad facing one side of the rail module;

a second brake member comprising a second brake pad facing an opposite side of the one side of the rail module; and a connection member connecting the first brake member to the second brake member so that the first brake member and the second brake member are integrally driven.

13. The tower lift of claim 12, wherein one end of the elastic member is fixed to a connection member hooking portion formed on the connection member.

14. The tower lift of claim 12, wherein a widest surface of the first brake pad and a widest surface of the second brake pad are configured to stop the drop of the carriage module by coming in contact with at least a portion of the rail module.

15. A tower lift comprising:

a rail module extending in a vertical direction;

a carriage module provided to be movable along the rail module by magnetic levitation; and a brake device integrated with the carriage module and configured to move along the rail module, wherein the brake device comprises:

a base body structure having a relative position fixed with respect to the carriage module, providing an inclined surface, and comprising a roller bearing in contact with one surface of the brake body and configured to be rotatable;

a brake structure configured to move along the inclined surface of the base body structure to stop a drop of the carriage module by selectively coming in contact with the rail module, the brake structure including:

a first brake member comprising a first brake pad facing one side of the rail module;

a second brake member comprising a second brake pad facing an opposite side of the one side of the rail module; and a connection member connecting the first brake member to the second brake member so that the first brake member and the second brake member are integrally driven;

an elastic member disposed on the brake structure and configured to apply an elastic force in an upward direction to the brake structure, one end of the elastic member is fixed to a connection member hooking portion formed on the connection member; and a driving controller configured to make the brake structure selectively come in contact with the rail module by holding the brake device only when power for driving the tower lift is supplied, wherein the rail module is between the base body structure and the brake structure so that the brake structure is in contact with both side walls of the rail module, wherein the brake structure is further configured to stop the drop of the carriage module when the power is cut off, and wherein a widest surface of the first brake pad and a widest surface of the second brake pad are configured to stop the drop of the carriage module by coming in contact with at least a portion of the rail module.

16. The tower lift of claim 15, further comprising a returner configured to return the brake structure to an original position after the brake structure stops the drop of the carriage module by selectively coming in contact with the rail module, wherein the driving controller comprises:

an electromagnet configured to generate a magnetic force when the power is applied to the electromagnet; and a holding member held by the electromagnet when the electromagnet generates the magnetic force, and the returner comprises:

a motor; and a contact portion connected to the motor and configured to attach the holding member to the electromagnet by using a rotational force.

* * * * *